United States Patent [19]
Koshikawa

[11] Patent Number: 5,901,097
[45] Date of Patent: May 4, 1999

[54] READ BUS CONTROLLING APPARATUS FOR SEMICONDUCTOR STORAGE DEVICE

[75] Inventor: Yasuji Koshikawa, Tokyo, Japan

[73] Assignee: NEC Corporation, Tokyo, Japan

[21] Appl. No.: 08/859,715

[22] Filed: May 21, 1997

[30] Foreign Application Priority Data

May 24, 1996 [JP] Japan .................................. 8-153091

[51] Int. Cl.⁶ .................................................. G11C 7/00
[52] U.S. Cl. ........................................ 365/203; 365/207
[58] Field of Search .............................. 365/203, 189.09, 365/190, 207

[56] References Cited

U.S. PATENT DOCUMENTS

| | | | |
|---|---|---|---|
| 5,023,841 | 6/1991 | Akrout et al. | 365/205 |
| 5,500,820 | 6/1996 | Makaoka | 365/189.01 |
| 5,640,355 | 6/1997 | Muraoka et al. | 365/207 |

*Primary Examiner*—David C. Nelms
*Assistant Examiner*—Hoai Ho
*Attorney, Agent, or Firm*—Whitham, Curtis & Whitham

[57] ABSTRACT

The invention provides a semiconductor storage device which is comparatively short in read time. A read route is formed from a first read bus pair connected to a plurality of sense amplifiers, to which a bit line pair is inputted, and inputted to a first data amplifier, a second read bus pair connected to the first data amplifier connected to the sense amplifiers, to which the bit line pair is inputted, and also to a precharge circuit and inputted to a second data amplifier, a third read bus outputted from the second data amplifier and inputted to a data output buffer, and a bus extending from the data output buffer to an output terminal. The precharge circuit is connected to the second read buses in the proximity of the first data amplifier connected to the second read buses at a position remote from the connection points between the second data amplifier and the second read buses.

5 Claims, 11 Drawing Sheets

PRIOR ART

FIG.7 PRIOR ART

READ BUS CONTROLLING APPARATUS FOR SEMICONDUCTOR STORAGE DEVICE

BACKGROUND OF THE INVENTION

1. Field of the Invention

This invention relates to a semiconductor storage device, and more particularly to a control circuit for a read bus of a semiconductor storage device.

2. Description of the Related Art

In recent years, as the capacity of a semiconductor storage device increases, the chip size is inclined to increase. Consequently, the wiring for a read bus is so increasing that such problems as a delay in data transmission time and an increase in charge/discharge current of a wiring become significant.

Therefore, transmission of read data is frequently performed with a very small potential difference between two buss to achieve a high speed operation and reduction in current consumption.

Figure 5:
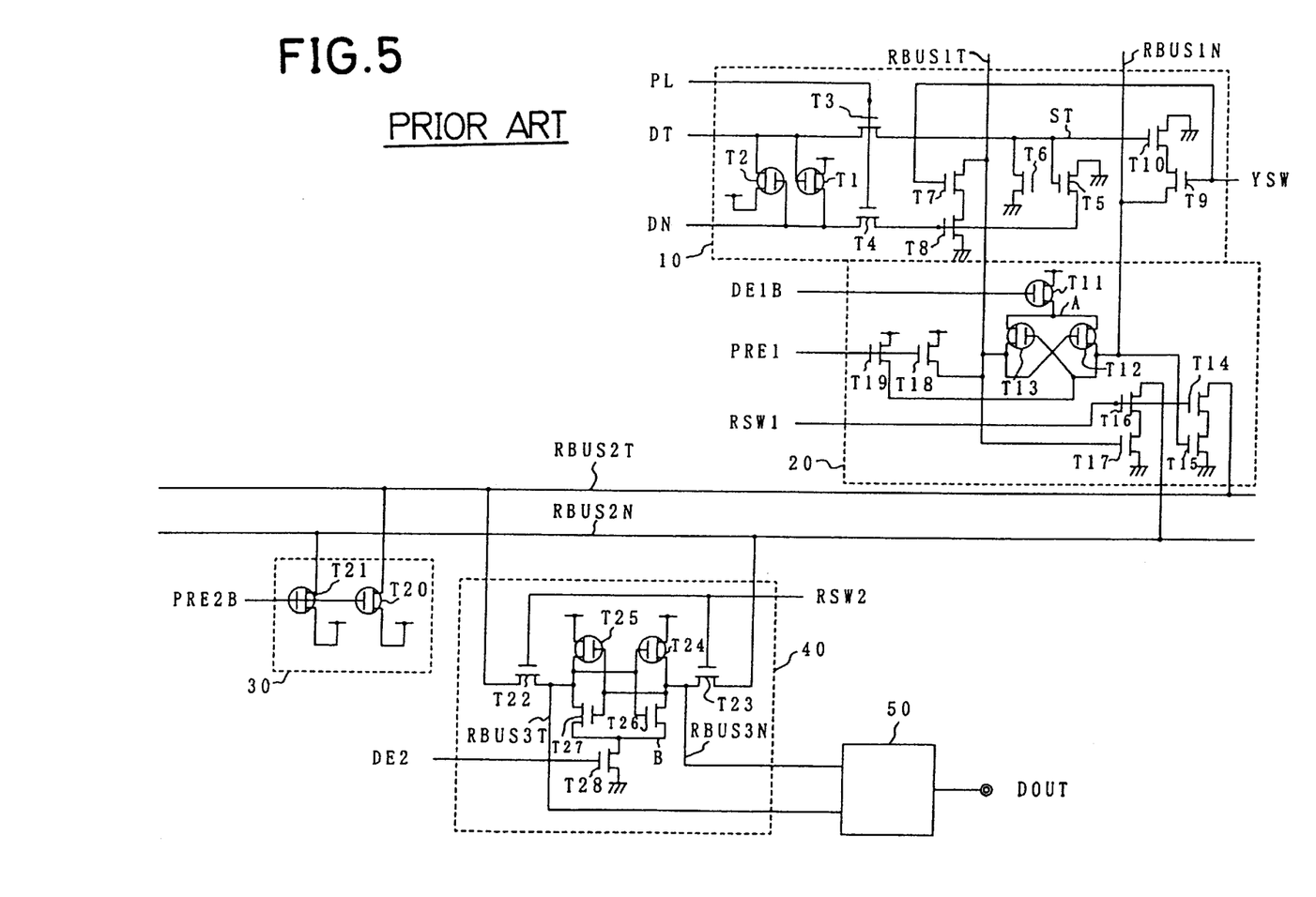
FIG. 5 is a circuit diagram showing a conventional semiconductor storage device.

FIG. 5 shows an example of a circuit construction of a semiconductor storage apparatus of the type described above.

Referring to FIG. 5, a read route is formed from a plurality of first read bus pairs RBUS1T and RBUS1N connected to a plurality of sense amplifiers 10, to which a bit line pair DT and DN is inputted, and inputted to a plurality of first data amplifiers 20, a second read bus pair RBUS2T and RBUS2N connected to the first data amplifiers 20 and also to a precharge circuit 30 and inputted to a second data amplifier 40, a third read bus pair RBUS3T and RBUS3N outputted from the second data amplifier and inputted to a data output buffer 50, and a still further bus from the data output buffer 50 to an output terminal DOUT.

Each of the sense amplifiers 10 is formed from a Please add the following claims: P-channel transistor T1 having a gate to which the bit line DT is inputted and connected between a power supply and the bit line DN, another P-channel transistor T2 having a gate to which the bit line DN is inputted and connected between the power supply and the bit line DT, an N-channel transistor T3 having a gate to which a plate selection signal PL is inputted and connected between the bit line DT and a nodal point ST, another N-channel transistor T4 having a gate to which the plate selection signal PL is inputted and connected between the bit line DN and another nodal point SN, a further N-channel transistor T5 having a gate to which the nodal point ST is inputted and connected to the ground GND and the nodal point SN, a still further N-channel transistor T6 having a gate to which the nodal point SN is inputted and connected between the ground GND and the nodal point ST, a pair of yet further N-channel transistors T7 and T8 connected in series between the first read bus RBUS1T and the ground GND, the N-channel transistor T7 having a gate to which a column selection line YSW is inputted, the N-channel transistor T8 having a gate to which the nodal point SN is inputted, and a pair of yet further N-channel transistors T9 and T10 connected in series between the first read bus RBUS1N and the ground GND, the N-channel transistor T9 having a gate to which the column selection line YSW is inputted, the N-channel transistor T10 having a gate to which the nodal point ST is inputted.

Each of the first data amplifiers 20 is formed from a P-channel transistor T11 having a gate to which a first data amplification activation signal DE1B is inputted and connected between the power supply and a nodal point A, another P-channel transistor T12 having a gate to which the first read bus RBUS1T is inputted and interposed between the nodal point A and the first read bus RBUS1N, a further P-channel transistor T13 having a gate to which the first read bus RBUS1N is inputted and interposed between the nodal point A and the first read bus RBUS1T, a pair of N-channel transistors T14 and T15 interposed in series between the second read bus RBUS2T and the ground GND, the N-channel transistor T14 having a gate to which a first read switch RSW1 is inputted, the N-channel transistor T15 having a gate to which the first read bus RBUS1N is inputted, a pair of further N-channel transistors T16 and T17 interposed in series between the second read bus RBUS2N and the ground GND, the N-channel transistor T16 having a gate to which the first read switch RSW1 is inputted, the N-channel transistor T17 having a gate to which the first read bus RBUS1T is inputted, a still further N-channel transistor T18 having a gate to which a first precharge signal PRE1 is inputted and connected between the first read bus RBUS1T and the power supply, and a yet further N-channel transistor T19 having a gate to which the first precharge signal PRE1 is inputted and connected between the first read bus RBUS1N and the power supply.

The precharge circuit 30 is formed from a P-channel transistor T20 having a gate to which a second precharge signal PRE2B is inputted and connected between the second read bus RBUS2T and the power supply, and another P-channel transistor T21 having a gate to which the second precharge signal PRE2B is inputted and connected between the second read bus RBUS2N and the power supply.

Further, the second data amplifier 40 is formed from an N-channel transistor T22 having a gate to which a second read switch RSW2 is inputted and connected between the second read bus RBUS2T and the third read bus RBUS3T, another N-channel transistor T23 having a gate to which the second read switch RSW2 is inputted and connected between the second read bus RBUS2N and the third read bus RBUS3N, a P-channel transistor T24 having a gate to which the third read bus RBUS3T is inputted and connected between the power supply and the third read bus RBUS3N, another P-channel transistor T25 having a gate to which the third read bus RBUS3N is inputted and connected between the power supply and the third read bus RBUS3T, a further N-channel transistor T26 having a gate to which the third read bus RBUS3T is inputted and connected between the third read bus RBUS3N and a nodal point B, a still further N-channel transistor T27 having a gate to which the third read bus RBUS3N is inputted and connected between the third read bus RBUS3T and the nodal point B, and a yet further N-channel transistor T28 having a gate to which a second data amplification activation signal DE2 is inputted and connected between the nodal point B and the ground GND.

It is to be noted that the transistors T1 and T2, the transistors T3 and T4, the transistors T5 and T6, the transistors T7 and T9, the transistors T8 and T10, the transistors T12 and T13, the transistors T14 and T16, the transistors T15 and T17, the transistors T18 and T19, the transistors T20 and T21, the transistors T22 and T23, the transistors T24 and T25, and the transistors T26 and T27 are transistors which individually exhibit same characteristics if an equal gate potential is applied.

Figure 6:
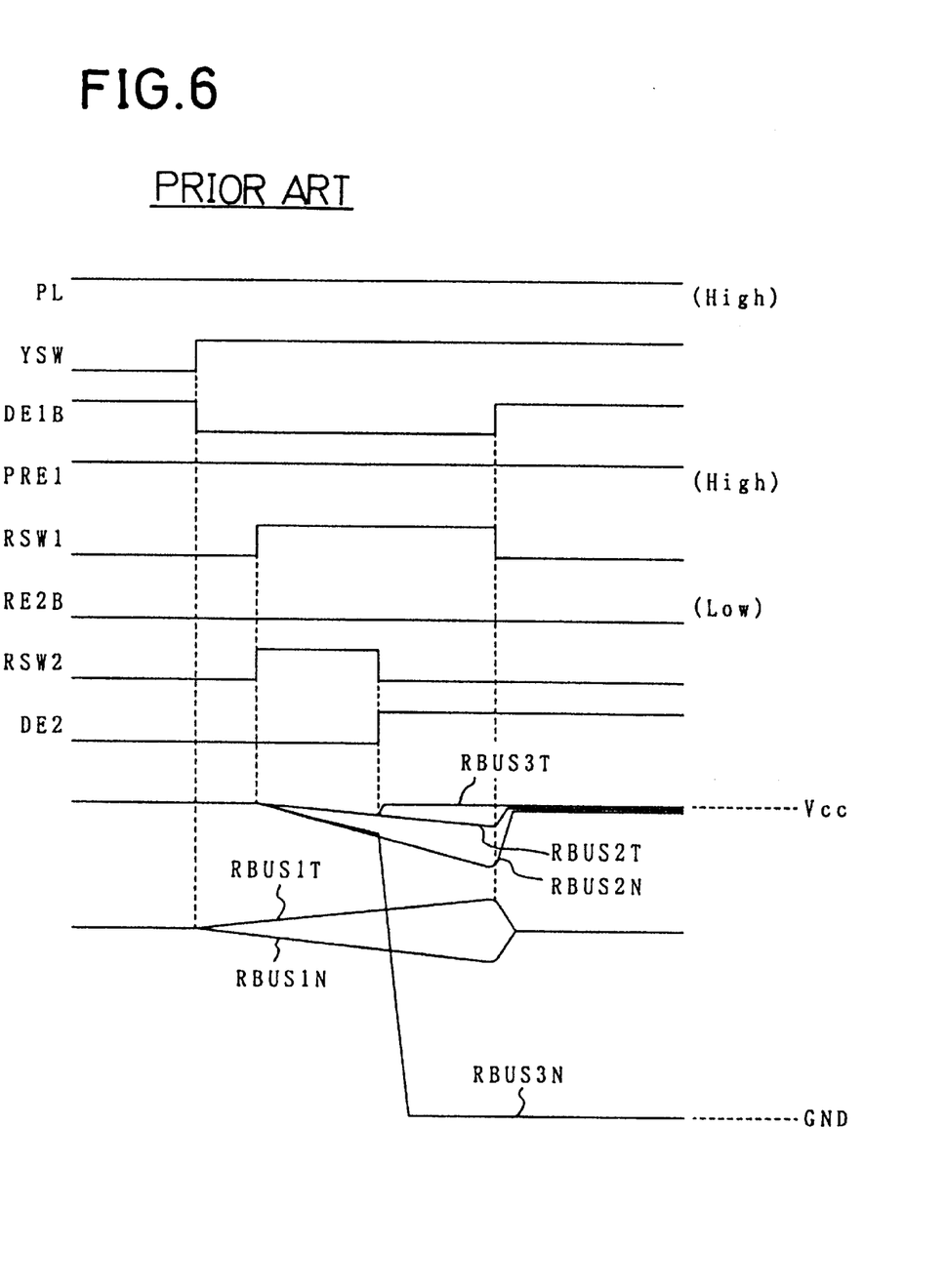
FIG. 6 is a waveform diagram illustrating operation of the semiconductor storage device shown in FIG. 5.

Subsequently, operation of the semiconductor storage apparatus shown in FIG. 5 will be described. FIGS. 6(a) and 6(b) are waveform diagrams illustrating operation of the semiconductor storage apparatus shown in FIG. 5.

If a word line (not shown in FIG. 5) is selected and data of a memory cell (not shown in FIG. 5) appears on the bit line pair DT and DN, then if the plate selection signal PL is High, then the transistors T3 and T4 are conducting and the data is transmitted also to the nodal points ST and SN.

Thereafter, as seen also in FIGS. 6(a) and 6(b), if the column selection line YSW becomes High and the first data amplification activation signal DE1B becomes Low when the first precharge signal PRE1 is Low and the first read bus pair RBUS1T and RBUS1N is in a condition precharged to a potential lower by a threshold value of the transistors T18 and T19 than the power supply level, then a current route from the power supply to the ground GND via the transistors T11, T12, T9 and T10 and another current route from the power supply to the ground GND via the transistors T11, T13, T7 and T8 are produced.

In this instance, since the potentials at the nodal points ST and SN are different from each other, a difference is produced between the on-resistances (resistance values between the drain and the source) of the transistors T8 and T10, and a potential difference is produced also between the potentials of the first read buses RBUS1T and RBUS1N. Further, this potential difference is amplified by the first data amplifiers 20 and gradually becomes large.

FIGS. 6(a) and 6(b) illustrate a case of data when the DT, ST and RBUS1T sides become High and the DN, SN, RBUS1N sides become Low.

Then, if the first read switch RSW1 becomes High, then since the second precharge signal PRE2B is Low, a current route from the power supply to the ground GND via the transistors T20, T14 and T15 and another current route from the power supply to the ground GND via the transistors T21, T16 and T17 are produced. In this instance, since the potentials of the first read buses RBUS1T and RBUS1N are different from each other, a difference is produced between the on-resistances of the transistors T15 and T17, and a potential difference is produced also between the second read buses RBUS2T and RBUS2N.

Further, if the second read switch RSW2 becomes High, the n the potentials at the second read buses RBUS2T and RBUS2N are transmitted to the third read buses RBUS3T and RBUS3N via the transistors T22 and T23, respectively.

After the potentials are transmitted sufficiently to the third read buses RBUS3T and RBUS3N, if the second read switch RSW2 is changed to Low and the second data amplification activation signal DE2 is changed to High, then the potentials of the third read buses RBUS3T and RBUS3N are amplified to the power supply potential VCC and the potential ground GND, respectively, by the second data amplifier 40.

The data of the memory cell transmitted to the third read bus pair RBUS3T and RBUS3N as described above is outputted to the output terminal DOUT via the data output buffer 50.

Figure 7:
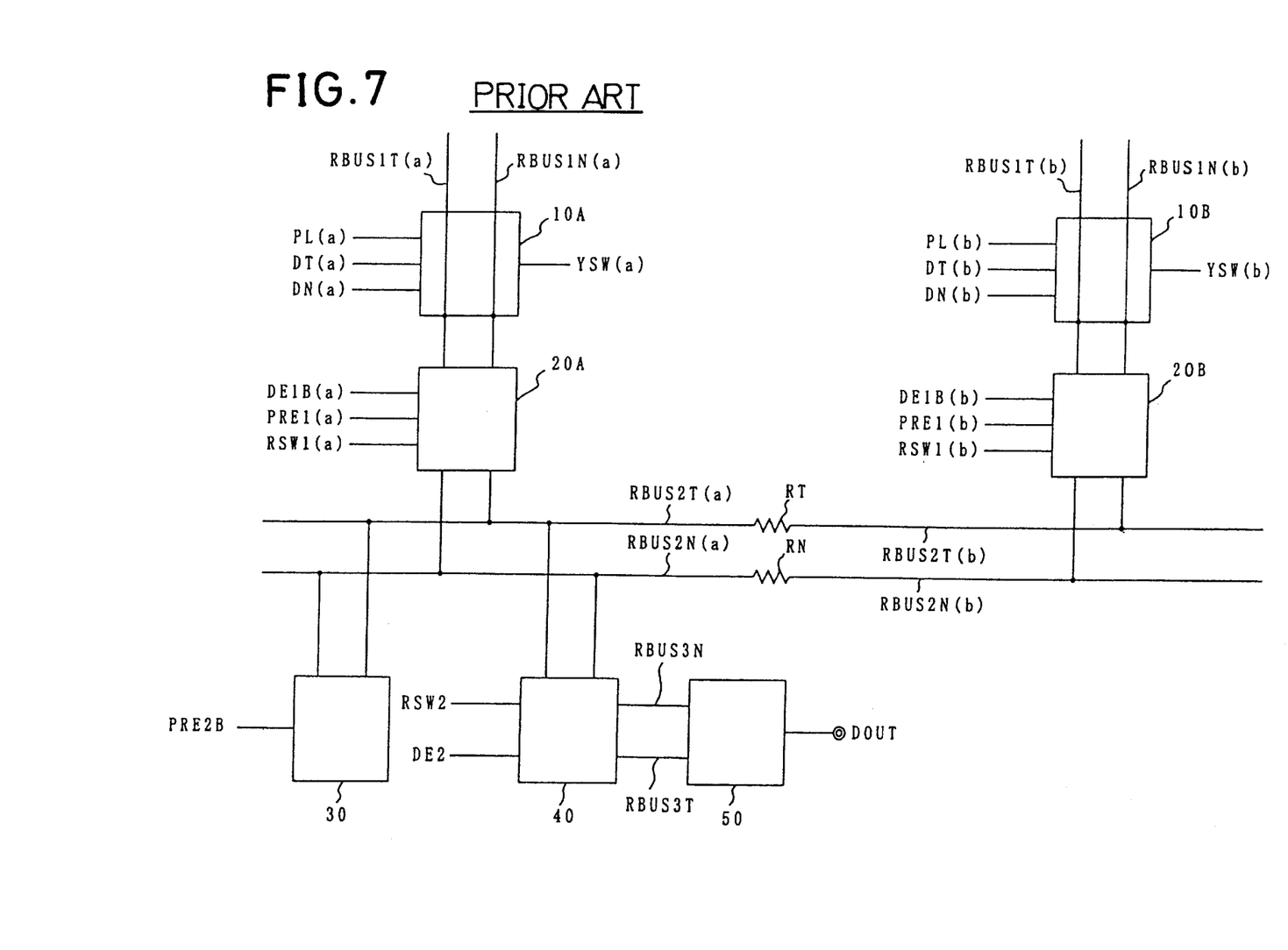
FIG. 7 is a block diagram showing details of part of the semiconductor storage device.

FIG. 7 shows a relationship in arrangement of, from among the first data amplifiers 20 connected to the second read buses RBUS2T and RBUS2N in pair, the first data amplifier 20A connected to the second read buses RBUS2T and RBUS2N at a position proximate to connection points between the second data amplifier 40 and the second read buses RBUS2T and RBUS2N and the first data amplifier 20B connected to the second read buses RBUS2T and RBUS2N at a position remote from the connection points between the second data amplifier 40 and the second read buses RBUS2T and RBUS2N.

Referring to FIG. 7, the first data amplifier 20A receives a first data amplification activation signal DE1B(a), a first precharge signal PRE1(a), a first read switch RSW1(a) and a first read bus pair RBUS1T(a) and RBUS1N(a) as inputs thereto, and the sense amplifier 10A to which the first read bus pair RBUS1T(a) and RBUS1N(a) is connected receives a plate selection signal PL(a) and a bit line pair DT(a) and DN(a) as inputs thereto.

The first data amplifier 20B receives a first data amplification activation signal DE1B(b), a first precharge signal PRE1(b), a first read switch RSW1(b) and a first read bus pair RBUS1T(b) and RBUS1N(b) as inputs thereto, and the sense amplifier 10B to which the first read bus pair RBUS1T(b) and RBUS1N(b) is connected receives a plate selection signal PL(b) and a bit line pair DT(b) and DN(b) as inputs thereto.

It is to be noted that a precharge circuit 30, a second data amplifier 40 and a data output buffer 50 have constructions similar to those shown in FIG. 5, and the precharge circuit 30 is connected to the second read buses RBUS2T and RBUS2N at a position in the proximity of the connection points between the second data amplifier 40 and the second read buses RBUS2T and RBUS2N.

Here, parasitic resistances RT and RN of wirings are present between the points (RBUS2T(a) and RBUS2N(a)) of the second read bus pair RBUS2T and RBUS2N at which the first data amplifier 20A is connected thereto and the points (RBUS25(b) and RBUS2N(b)) of the second read bus pair RBUS2T and RBUS2N at which the first data amplifier 20B is connected thereto.

Figure 8A:
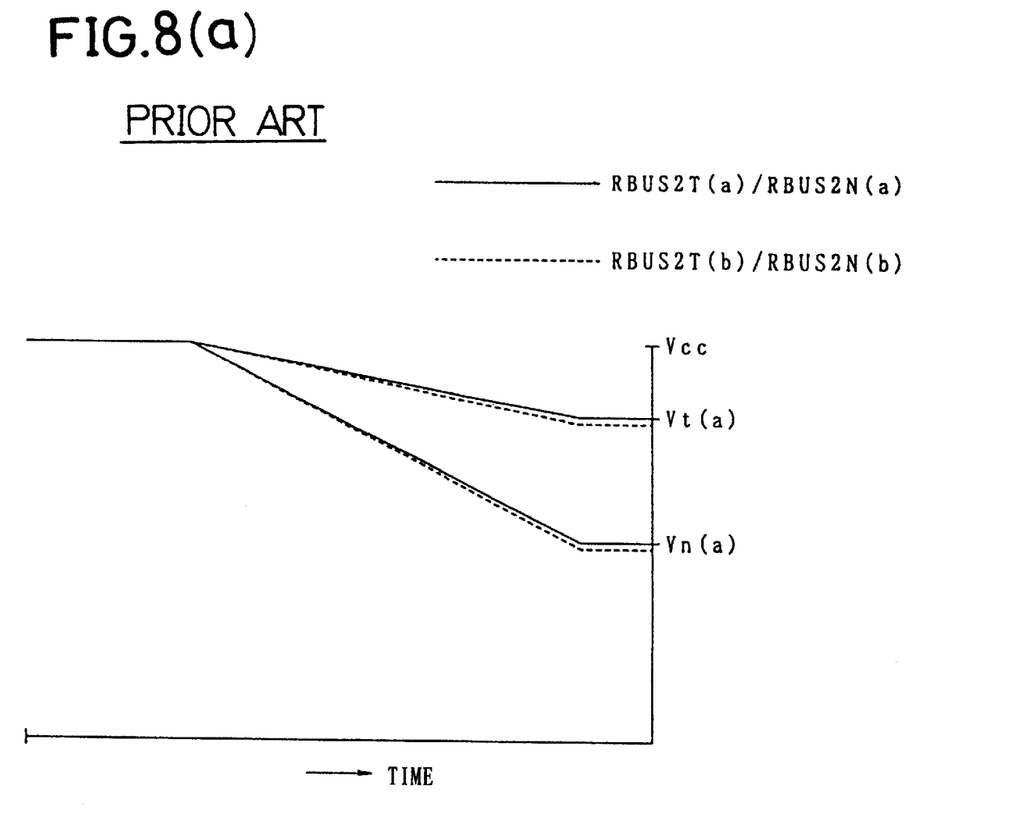
FIGS. 8(a) and 8(b) waveform diagrams illustrating operation of the semiconductor storage device shown in FIG. 7.
Figure 8B:
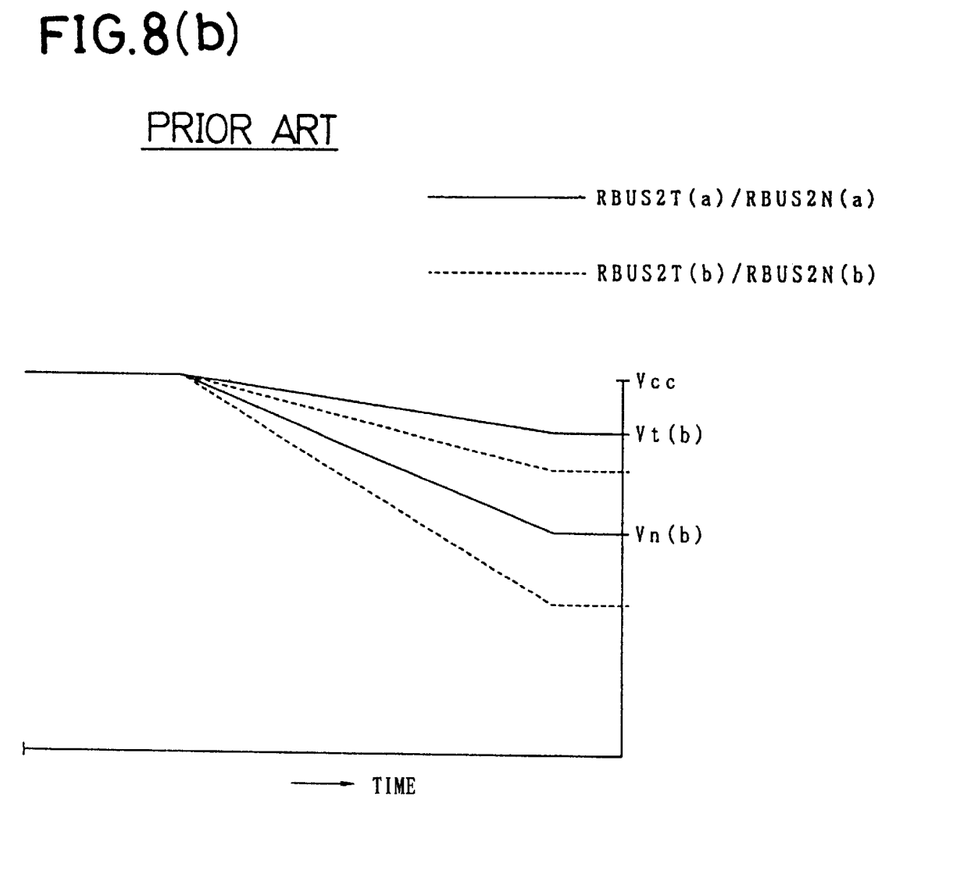

FIG. 8(a) illustrates variations of the potentials of the second read buses RBUS2T(a) and RBUS2N(a) and the second read buses RBUS2T(b) and RUBS2N(b) when the first data amplifier 20A is activated, and FIG. 8(b) illustrates variations of the potentials of the second read buses RBUS2T(a) and RBUS2N(a) and the second read buses RBUS2T(b) and RBUS2N(b) when the first data amplifier 20B is activated, for comparison.

The potentials Vt(a) and Vn(a) at which the second read bus pair RBUS2T(a) and RUBS2N(a) is saturated after the first read switch RSW1(a) becomes High and the potentials Vt(b) and Vn(b) at which the second read bus pair RBUS2T(a) and RBUS2N(a) is saturated after the first read switch RSW1(b) becomes High are given, where tile power supply voltage is represent by VCC, the on-resistances of the transistors T20 and T21 are represented by rP, the on-resistances of the transistors T14 and T15 and the transistors T16 and T17 connected in series are represented by rNh and eNl, respectively, and the magnitudes of the parasitic resistances RT and RN of the second read bus pair RBUS2T and RBUS2N are represented by rLINE, by the following expressions (1) to (4):

$$Vt(a) = \frac{rNh}{(rNh + rP)} \times Vcc \quad (1)$$

$$Vn(a) = \frac{rNl}{(rNl + rP)} \times Vcc \quad (2)$$

$$Vt(b) = \frac{(rNh + rLINE)}{(rNh + rLINE + rP)} \times Vcc \quad (3)$$

$$Vn(b) = \frac{(rNl + rLINE)}{(rNl + rLINE + rP)} \times Vcc \quad (4)$$

The potential differences Vt(a)–Vn(a) and Vt(b)–Vn(b) of the second read bus pair RBUS2T(a) and RBUS2N(a) in the individual instances are given by the following expressions (5) and (6), respectively:

$$Vt(a) - Vn(a) = \left(\frac{rNh}{(rNh + rP)} - \frac{rNl}{(rNl + rP)}\right) \times Vcc \qquad (5)$$

$$= \frac{(rNh - rNl) \times rP}{(rNh + rP) \times (rNl + rP)} \times Vcc$$

$$Vt(b) - Vn(b) = \left(\frac{rNh + rLINE}{rNh + rLINE + rP} - \frac{rNl + rLINE}{(rNl + rLINE + rP)}\right) \times Vcc \qquad (6)$$

$$= \frac{(rNh - rNl) \times rP}{(rNh + rLINE + rP) \times (rNl + rLINE + rP)} \times Vcc$$

Consequently, comparison between the potential differences Vt(*a*)–Vn(*a*) and Vt(*b*)–Vn(*b*) of the second read bus pair RBUS2T(*a*) and RBUS2N(*a*) in the individual cases is given by, since the parasitic resistance rLINE has a positive value, the following expression (7):

$$|Vt(a) - Vn(a)| > |Vt(b) - Vn(b)| \qquad (7)$$

It is to be noted that, while the second read bus pair RBUS2T and RBUS2N is considered in terms of the saturation potential, since, even if comparison is made at a certain point of time before the second read bus pair RBUS2T and RBUS2N reaches the saturation potential, the expression (7) of a result of the comparison between the potential differences similarly applies, the potential difference between the second read bus pair RBUS2T(*a*) and RBUS2N(*a*) when the second read switch RSW2 is changed to High is larger and the operation margin of the second data amplifier 40 is larger when the first data amplifier 20A is activated than when the first data amplifier 20B is activated.

In this manner, in the conventional semiconductor storage device described above, since the potential difference of the second read bus pair RBUS2T(*a*) and RBUS2N(*a*) at the point at which they are inputted to the second data amplifier 40 is smaller when data is transmitted from the first data amplifier 20B which is connected to the second read buses RBUS2T and RBUS2N at a position remote from the connection points between the second data amplifier 40 and the second read buses RBUS2T and RBUS2N than when data is transmitted from the first data amplifier 20A which is connected to the second read buses RBUS2T and RBUS2N at a position near to the connection points between the second data amplifier 40 and the second read buses RBUS2T and RBUS2N, starting of amplification of the second data amplifier 40 must wait until the smaller potential difference is obtained sufficiently. Consequently, the conventional semiconductor storage device is disadvantageous in that such waiting causes a delay in data transmission time.

While the potential difference can be obtained in a shorter time if the capacities (current driving capacities) of the transistors T14, T16, T15 and T17 of the first data amplifiers 20 are raised with respect to that of the transistors T20 and T21 of the precharge circuit 30, this involves a limitation since this causes an increase in current consumption.

Further, if the second data amplifier 40 is set so as to start its amplification at a time at which the potential difference when data is transmitted from the first data amplifier 20B which is connected to the second read buses RBUS2T and RBUS2N at a position remote from the connection points between the second data amplifier 40 and the second read buses RBUS2T and RBUS2N is obtained sufficiently, then since transmission of data from the first data amplifier 20A which is connected to the second read buses RBUS2T and RBUS2N at a position near to the connection points between the second data amplifier 40 and the second read buses RBUS2T and RBUS2N will excessively lower the potentials of the second read bus pair RBUS2T and RBUS2N, a second problem is caused that the time for precharging the second read bus pair RBUS2T and RBUS2N again after the data is transmitted increases.

If the transistors T21 and T22 for precharging the second read buses RBUS2T and RBUS2N are made larger in order to reduce the precharging time, not only the current consumption increases, but also the capacities of the transistors T14, TiG, T15 and T17 become relatively low. Consequently, the preceding problem becomes more serious.

In recent years, since the capacity of semiconductor storage device has increased and also the chip area has increased, the parasitic resistances of the wirings for the second read bus pair RBUS2T and RBUS2N are high. Consequently, the problem described above has become significant.

Further, as the speed of operation of a semiconductor storage device increases, also another semiconductor storage device which has a pipeline function in the inside thereof and transfers data successively in a short cycle time has become available. In a semiconductor storage device of the type just mentioned, after the second read switch is switched off, unless the second read bus pair RBUS2T and RBUS2N is precharged at a high speed to prepare for data transmission of a next cycle, the cycle type characteristic is deteriorated. Consequently, also the second problem described above has become significant.

SUMMARY OF THE INVENTION

It is an object of the present invention to provide a semiconductor storage device which exhibits a comparatively short read time.

In order to attain the object described above, according to an aspect of the present invention, there is provided a semiconductor storage device, comprising a first read bus connected to a sense amplifier to which a bit line pair is inputted, the first read bus being inputted to a first data amplifier, a second read bus connected to a plurality of first data amplifiers and also to a precharge circuit and inputted to a second data amplifier, a third read bus outputted from the second data amplifier and inputted to a data output buffer, and an additional bus extending from the data output buffer to an output terminal, the first, second and third read buses and the additional bus cooperatively forming a read route, the precharge circuit being connected to the second read bus at a position in the proximity of one of the first data amplifiers which is connected to the second read bus at a position spaced from a connection point between the second data amplifier and the second read bus.

In the semiconductor storage device, since it is constructed such that the precharge circuit is connected to the second read bus at a position remote from the connection points between the second data amplifier and the second read bus, both of the potentials at which the second read bus pair is saturated after a first read switch changes High and the potentials at which the second read bus pair is saturated after the first read switch changes to High are low, and the potential difference of the second read bus pair is large. Consequently, the operation margin of the second data amplifier is large, and the semiconductor storage device is advantageous in that, by activating a second read switch at an earlier time, improvement in read time characteristic can be realized without increasing the current consumption.

According to another aspect of the present invention, there is provided a semiconductor storage device, comprising a plurality of sense amplifiers, a plurality of first data amplifiers, a first read bus pair inputted to the sense amplifiers and one of the first data amplifiers so that a potential difference may be amplified by the first data amplifier, a precharge circuit, a second data amplifier, a second read bus pair inputted to the first data amplifiers, the precharge circuit and the second data amplifier and driven to a second potential with a capacity according to data of the first read bus pair by the one first data amplifier while driven to a first potential with a fixed capacity by the precharge circuit, a data output buffer, a third read bus pair inputted to the second data amplifier and the data output buffer and amplified by the second data amplifier in response to a potential difference of the second read bus pair, an output terminal, and an additional bus extending from the data output buffer to the output terminal, the first, second and third read buses and the additional bus cooperatively forming a read route, the precharge circuit driving the second read bus pair at a position in the proximity of one of the first data amplifiers which is connected to wirings of the second read bus pair at a location at which a parasitic resistance is highest from the second data amplifier.

According to a further aspect of the present invention, there is provided a semiconductor storage device, comprising a plurality of sense amplifiers, a plurality of first data amplifiers, a first read bus pair inputted to the sense amplifiers and one of the first data amplifiers so that a potential difference may be amplified by the first data amplifier, a plurality of precharge circuits, a second data amplifier, a second read bus pair inputted to the first data amplifiers, the precharge circuits and the second data amplifier and driven to a second potential with a capacity according to data of the first read bus pair by the one first data amplifier while driven to a first potential with a fixed capacity by the precharge circuit, a data output buffer, a third read bus pair inputted to the second data amplifier and the data output buffer and amplified by the second data amplifier in response to a potential difference of the second read bus pair, an output terminal, and an additional bus extending from the data output buffer to the output terminal, the first, second and third read buses and the additional bus cooperatively forming a read route, the precharge circuits being connected to the second read bus pair at a plurality of locations of the second read bus pair including a location in the proximity of one of the first data amplifiers which is connected to wirings of the second read bus pair at a location at which a parasitic resistance is highest from the second data amplifier.

Also the semiconductor storage devices according to the second and third aspects of the present invention are advantageous similarly to the semiconductor storage device according to the first aspect.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
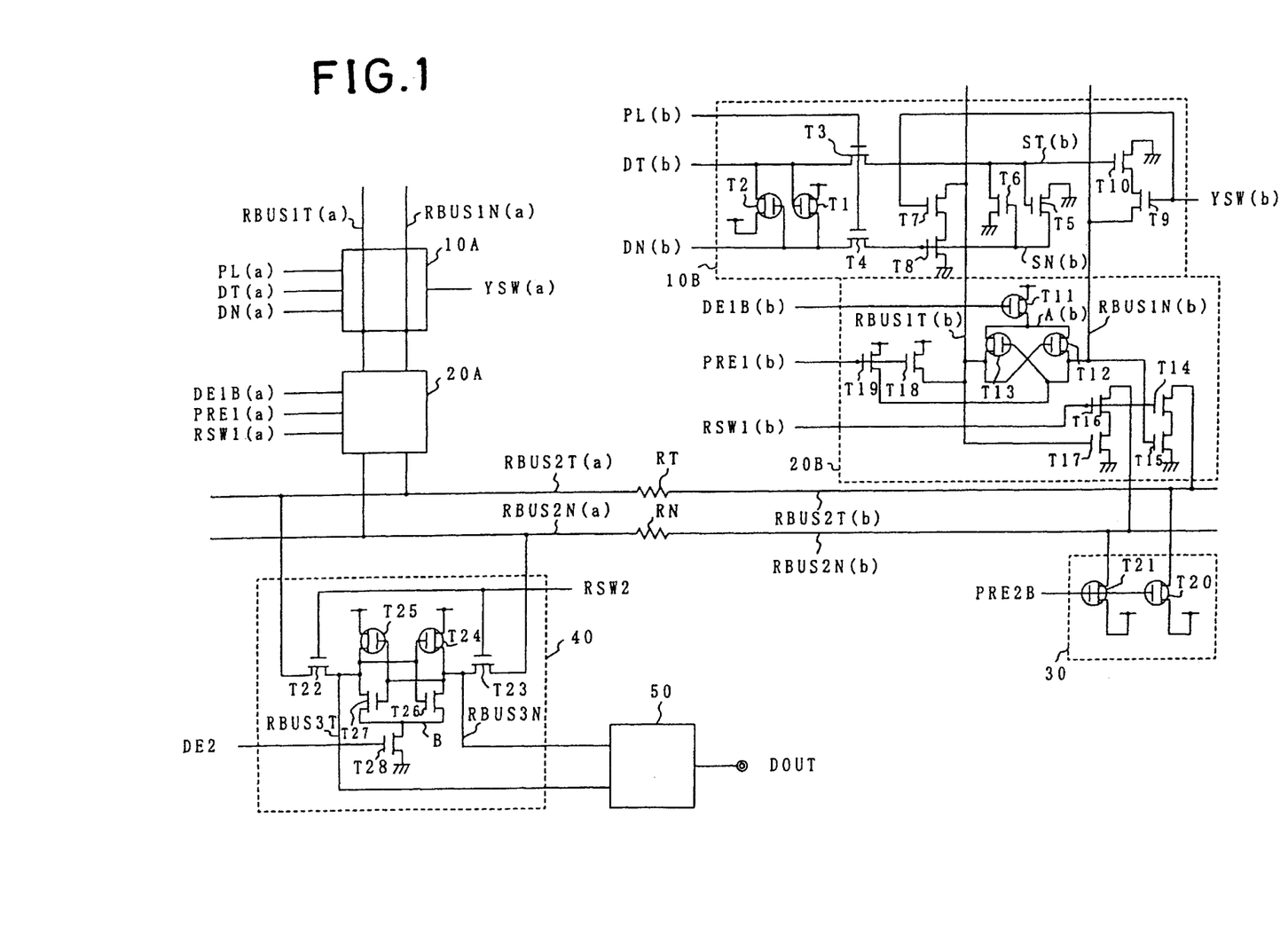
FIG. 1 is a circuit diagram of a semiconductor storage device showing a first preferred embodiment of the present invention.

Referring first to FIG. 1, there is shown a circuit construction of a semiconductor storage device according a first preferred embodiment of the present invention. In the semiconductor storage device shown, a read route is formed from a first read bus pair RBUS1T(a) and RBUS1N(a) connected to a plurality of sense amplifiers 10A, to which a bit line pair DT(a) and DN(a) is inputted, and inputted to a first data amplifier 20A, another first read bus pair RBUS1T(b) and RBUS1N(b) connected to a plurality of sense amplifiers 10B, to which another bit line pair DT(b) and DN(b) is inputted, and inputted to a first data amplifier 20B, a second read bus pair RBUS2T and RBUS2N connected to the first data amplifiers 20A and 20B and also to a precharge circuit 30 and inputted to a second data amplifier 40, a third read bus pair RBUS3T and RBUS3N outputted from the second data amplifier 40 and inputted to a data output buffer 50, and a still further bus from the data output buffer 50 to an output terminal DOUT.

It is to be noted that, referring to FIG. 1, those elements which have equivalent functions to those of the components of FIGS. 5 and 7 are denoted by same reference symbols, and particularly the sense amplifiers 10A and 10B, first data amplifiers 20A and 20B, precharge circuit 30, second data amplifier 40 and data output buffer 50 have similar constructions to those described hereinabove with reference to FIG. 7 and detailed description of them is omitted here.

If one of the first data amplifiers connected to the second read buses RBUS2T and RBUS2N in pair which is connected to the second read buses RBUS2T and RBUS2N at a position near to the connection points between the second data amplifier 40 and the second read buses RBUS2T and RBUS2N is represented as first data amplifier 20A and another one of the first data amplifiers which is connected to the second read buses RBUS2T and RBUS2N at another position remote from the connection points between the second data amplifier 40 and the second read buses RBUS2T and RBUS2N is represented as first data amplifier 20B as shown in FIG. 1, then similarly as in the circuit shown in FIG. 7, parasitic resistances RT and RN of wirings are present between points (RBUS2T(a) and RBUS2N(a)) of the second read bus pair RBUS2T and RBUS2N at which the sense amplifier 10A is connected and points (RBUS2T (b) and RBUS2N(b)) of the second read bus pair RBUS2T and RBUS2N at which the sense amplifier 10B is connected.

In the embodiment of the present invention, the precharge circuit 30 is connected to the second read buses RBUS2T and RBUS2N at a position remote from the connection points between the second data amplifier 40 and the second read bus pair RBUS2T and RBUS2N.

Figure 2A:
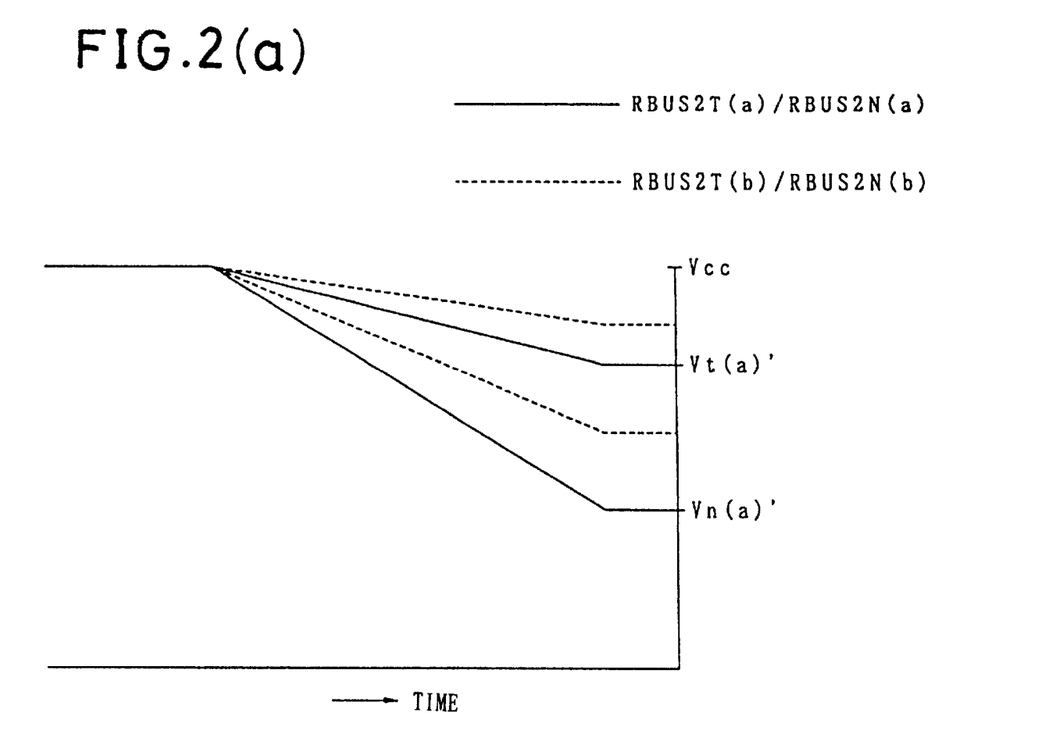
FIGS. 2(a) and 2(b) are waveform diagrams illustrating operation of the semiconductor storage device of FIG. 1.
Figure 2B:
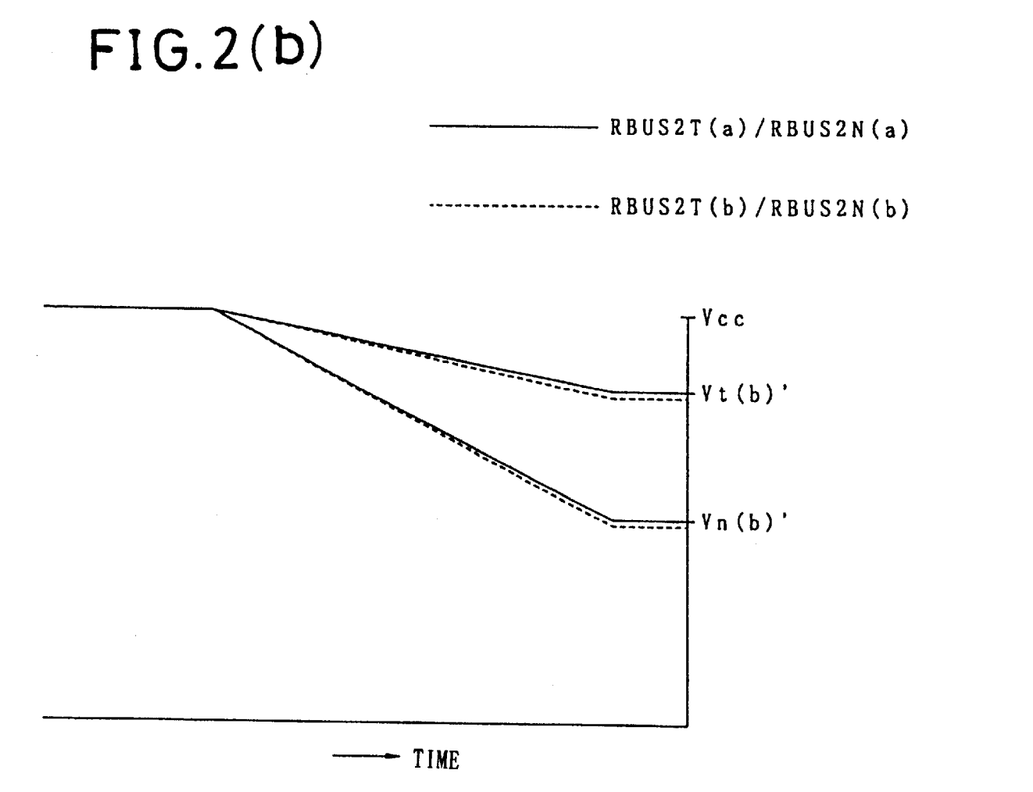

FIG. 2(a) illustrates variations of the potentials of the second read buses RBUS2T(a), RBUS2N(a) and the second read buses RBUS2T(b), RUBS2N(b) when the first data amplifier 20A is activated, and FIG. 2(b) illustrates variations of the potentials of the second read buses RBUS2T(a), RBUS2N(a) and the second read buses RBUS2T(b) and RBUS2N(b) when the first data amplifier 20B is activated, for comparison.

In the embodiment of the present invention, since the precharge circuit 30 is connected to the second read buses RBUS2T and RBUS2N at a position remote from the connection points between the second data amplifier 40 and the second read buses RBUS2T and RBUS2N, the potentials Vt(a)' and Vn(a)' at which the second read bus pair RBUS2T(a) and RBUS2N(a) is saturated after the first read switch RSW1(a) changes to High and the potentials Vt(b)' and Vn(b)' at which the second read bus pair RBUS2T(a) and RBUS2N(a) is saturated after the first read switch RSW1(b) changes to High are given, where the power supply voltage is represented by VCC, the on-resistance of the transistors T20 and T21 is represented by rP, the on-resistances of the transistors T14, T15 and T16, T17 connected in series are represented by rNh and rNl, respectively, and the magnitudes of the parasitic resistances RT and RN of the second read bus pair RBUS2T and RBUS2N are represented by rLINE, by the following expressions (8) to (11):

$$Vt(a)' = \frac{rNh}{(rNh + rLINE + rP)} \times Vcc \qquad (8)$$

$$Vn(a)' = \frac{rNl}{(rNl + rLINE + rP)} \times Vcc \qquad (9)$$

$$Vt(b)' = \frac{rNh}{(rNh + rP)} \times Vcc \qquad (10)$$

$$Vn(b)' = \frac{rNl}{(rNl + rP)} \times Vcc \qquad (11)$$

Meanwhile, the potential differences Vt(a)'−Vn(a)' and Vt(b)'−Vn(b)' of the second read bus pair RBUS2T(a) and RBUS2N(a) in the respective cases are given by the following expressions (12) and (13), respectively:

$$Vt(a)' - Vn(a)' = \left( \frac{rNh}{(rNh + rLINE + rP)} - \frac{rNl}{(rNl + rLINE + rP)} \right) \times Vcc \qquad (12)$$

$$= \frac{(rNh - rNl) \times (rLINE + rP)}{(rNh + rLINE + rP) \times (rNl + rLINE + rP)} \times Vcc$$

$$Vt(b)' - Vn(b)' = \left( \frac{rNh}{(rNh + rP)} - \frac{rNl}{(rNl + rP)} \right) \times Vcc \qquad (13)$$

$$= \frac{(rNh - rNl) \times rP}{(rNh + rP) \times (rNl + rP)} \times Vcc$$

Figure 3:
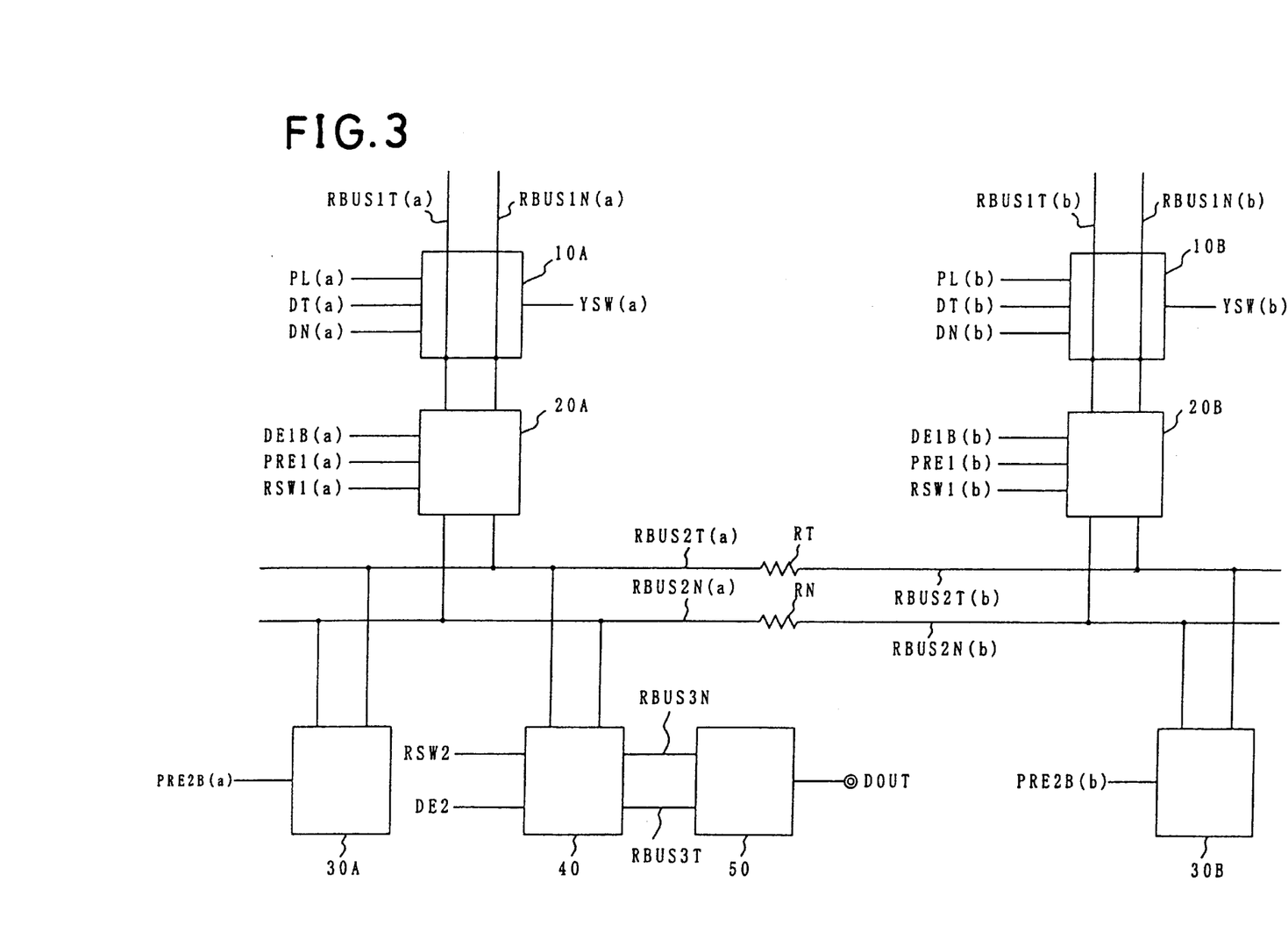
FIG. 3 is a block diagram of another semiconductor storage device showing a second preferred embodiment of the present invention.

FIG. 3 is a block diagram showing a semiconductor storage device according to a second preferred embodiment of the present invention. In FIG. 3, those elements having equivalent functions to those of FIG. 1 are denoted by same reference symbols.

Referring to FIG. 3, in the semiconductor storage device shown, a plurality of precharge circuits 30A and 30B are arranged with respect to a second read bus pair RBUS2T and RBUS2N such that the precharge circuit 30A is arranged at a position near to connection points between a second data amplifier and the second read bus pair RBUS2T and RBUS2N while the precharge circuit 30B is arranged at another position remote from the connection point between the second data amplifier and the second read bus pair RBUS2T and RBUS2N.

The other components of the semiconductor storage device including sense amplifiers 10A and 10B, first data amplifiers 20A and 20B, a second data amplifier 40 and a data output buffer 50 are constructed similarly to those of the semiconductor storage device described hereinabove with reference to FIGS. 5 and 7.

The precharge circuits 30A and 30B receive second precharge signals PRE2B(a) and PRE2B(b) as inputs thereto, respectively, and have a circuit construction similar to that of the precharge circuit 30 described hereinabove with reference to FIG. 5.

It is to be noted that the semiconductor storage device is controlled such that, when the first read switch RSW1(a) changes to High, the second precharge signal PRE2B(a) changes to Low and the second precharge signal PRE2B(b) changes high, but when the first read switch RSW1(b) changes to High, the second precharge signal PRE2B(b) changes to Low and the second precharge signal PRE2B(a) changes to High.

Figure 4A:
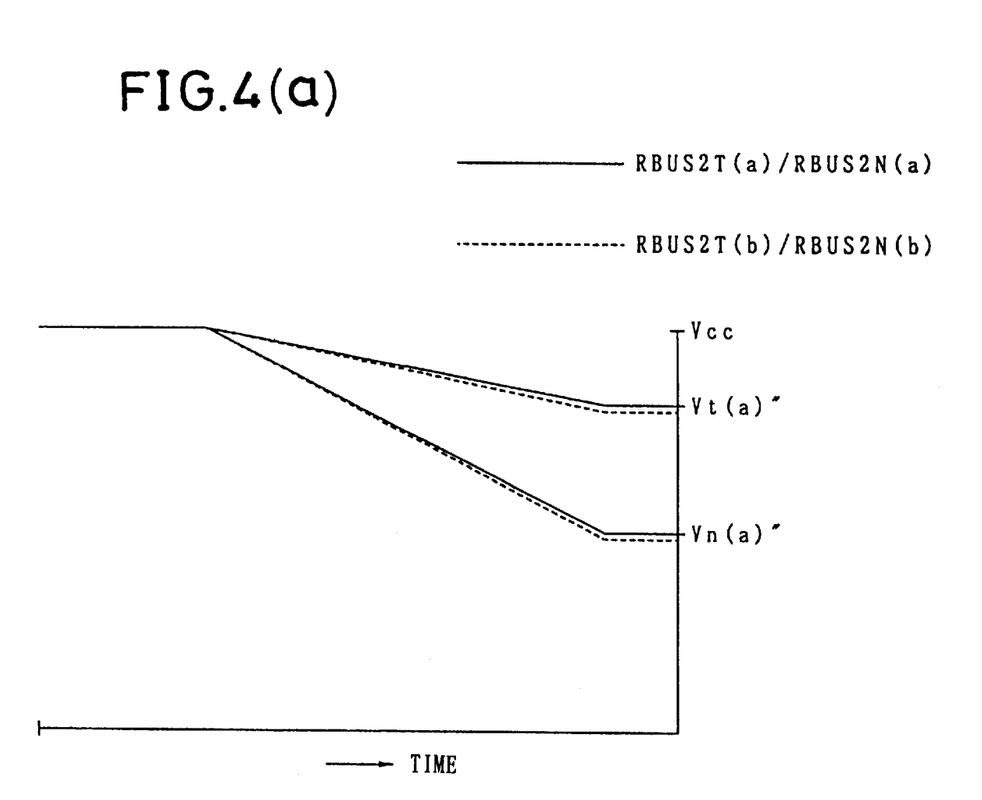
FIGS. 4(a) and 4(b) are waveform diagrams illustrating operation of the semiconductor storage device of FIG. 3.
Figure 4B:
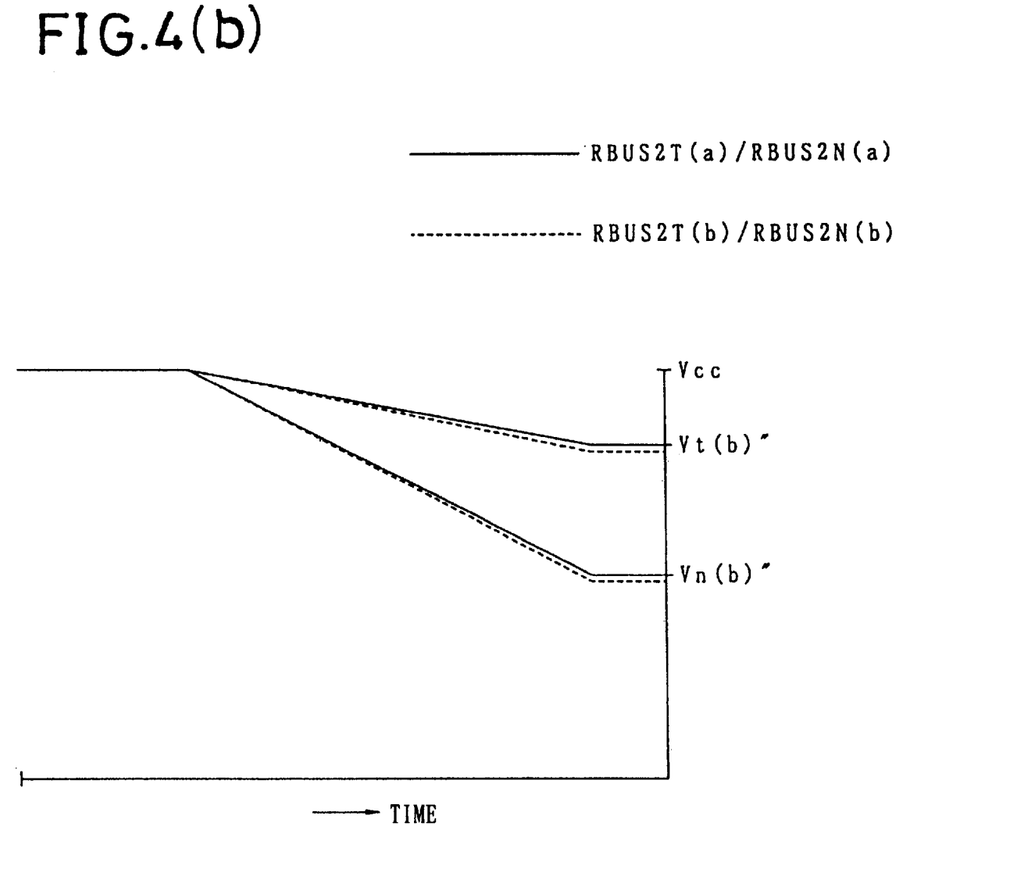

FIG. 4(a) illustrates variations of the potentials of the second read buses RBUS2T(a), RBUS2N(a) and the second read buses RBUS2T(b), RUBS2N(b) when the first data amplifier 20A is activated, and FIG. 4(b) illustrates variations of the potentials of the second read buses RBUS2T(a), RBUS2N(a) and the second read buses RBUS2T(b) and RBUS2N(b) when the first data amplifier 20B is activated, for comparison.

In the semiconductor storage device of the second embodiment, since the precharge circuits 30A and 30B are connected to the second read buses RBUS2T and RBUS2N at a position near to and another position remote from the connection points between the second data amplifier 40 and the second read buses RBUS2T(a) and RBUS2N(a), respectively, the potentials Vt(a)" and Vn(a)" at which the second read bus pair RBUS2T(a) and RUBS2N(a) is saturated after the first read switch RSW1(a) changes to High and the potentials Vt(b)" and Vn(b)" at which the second read bus pair RBUS2T(a) and RBUS2N(a) is saturated after the first read switch RSW1(b) changes to High are given, where the power supply voltage is represented by VCC, the on-resistance of the transistors T20 and T21 is represented by rP, and the on-resistances of the transistors T14, T15 and T16, T17 connected in series are represented by rNh and rNl, respectively, by the following expressions (14) to (17) independently of the parasitic resistances RT and RN of the second read bus pair RBUS2T and RBUS2N;

$$Vt(a)'' = \frac{rNh}{(rNh + rP)} \times Vcc \qquad (14)$$

$$Vn(a)'' = \frac{rNl}{(rNl + rP)} \times Vcc \qquad (15)$$

$$Vt(b)'' = \frac{rNh}{(rNh + rP)} \times Vcc \qquad (16)$$

$$Vn(b)'' = \frac{rNl}{(rNl + rP)} \times Vcc \qquad (17)$$

The potential differences of the second read bus pair RBUS2T(a) and RBUS2N(a) in the respective cases are given by the following expressions (18) and (19), respectively;

$$Vt(a)'' - Vn(a)'' = \left( \frac{rNh}{(rNh + rP)} - \frac{rNl}{(rNl + rP)} \right) \times Vcc \qquad (18)$$

$$= \frac{(rNh - rNl) \times rP}{(rNh + rP) \times (rNl + rP)} \times Vcc$$

$$Vt(b)'' - Vn(b)'' = \left( \frac{rNh}{(rNh + rP)} - \frac{rNl}{(rNl + rP)} \right) \times Vcc \qquad (19)$$

$$= \frac{(rNh - rNl) \times rP}{(rNh + rP) \times (rNl + rP)} \times Vcc$$

While the semiconductor storage devices of the first and second embodiments of the present invention are described above, they are advantageous as described below over the conventional semiconductor devices described hereinabove. First, according to the semiconductor storage device of the first embodiment described hereinabove with reference to FIG. 1, since the precharge circuit 30 is connected to the second read buses RBUS2T and RBUS2N at a position remote from the connection points between the second data amplifier 40 and the second read buses RBUS2T and RBUS2N, both of the potentials Vt(a)' and Vn(a)' at which the second read bus pair RBUS2T(a) and RBUS2N(a) is saturated after the first read switch RSW1(a) changes to High and the potentials Vt(b)' and Vn(b)' at which the second read bus pair RBUS2T(a) and RBUS2N(a) is saturated after the first read switch RSW1(b) changes to high are low and the potential difference of the second read bus pair RBUS2T(a) and RBUS2N(a) is large. Consequently, the operation margin of the second data amplifier is large. Accordingly, the semiconductor storage device is advantageous in that, by activating the second read switch at an earlier time, improvement in read time characteristic can be realized without increasing the current consumption.

Particularly, while the potential difference Vt(b)–Vn(b) of the second read bus pair RBUS2T and RBUS2N conventionally is, from the expression (6) given above, $$Vt(b) - Vn(b) = \frac{(rNh - rN1) \times rP}{(rNh + rLINE + rP) \times (rN1 + rLINE + rP)} \times Vcc$$

the potential differences VT(a)'–Vn(a)' and Vt(b)'–Vn(b)' of the second read pair RBUS2T and RBUS2N according to the expressions (12) and (13) are $$Vt(a)' - Vn(a)' = \frac{(rNh - rN1) \times (rLINE + rP)}{(rNh + rLINE + rP) \times (rN1 + rLINE + rP)} \times Vcc$$

$$Vt(b)' - Vn(b)' = \frac{(rNh - rN1) \times rP}{(rNh + rP) \times (rN1 + rP)} \times Vcc$$

Accordingly, both of the potential differences Vt(a)'–Vn(a)' and Vt(b)'–Vn(b)' are larger than the potential difference Vt(b)–Vn(b).

On the other hand, according to the semiconductor storage device of the second embodiment of the present invention described hereinabove with reference to FIG. 3, since the plurality of precharge circuits are connected to the second read bus pair RBUS2T and RBUS2N such that the two precharge circuits are connected to the second read buses RBUS2T and RBUS2N at a position near to and another position remote from the connection points between the second data amplifier 40 and the second read buses and the semiconductor storage device is controlled such that, when the first read switch RSW1(a) changes to High, the second precharge signal PRE2B(a) changes to Low and the second precharge signal PRE2B(b) changes to High, but when the first read switch RSW1(b) changes to High, the second precharge signal PRE2B(b) changes to Low and the second precharge signal PRE2B(a) changes to High, the potential difference of the second read bus pair RBUS2T(a) and RBUS2N(a) is large and besides the potentials of the second read buses do not drop excessively and the time required to precharge the second read buses again after transmission of data is short. Consequently, the semiconductor storage device is advantageous in that improvement in cycle time characteristic of a semiconductor storage device which has a pipeline function in the inside thereof and transfers data successively in a short cycle time can be realized without increasing the current consumption.

Particularly, while the potential differences Vt(a)"–Vn(a)" and Vt(b)"–Vn(b)" of the second read bus pair RBUS2T and RBUS2N according to the expressions (18) and (19) given hereinabove are $$Vt(a)'' - Vn(a)'' = \frac{(rNh - rN1) \times rP}{(rNh + rP) \times (rN1 + rP)} \times Vcc$$

$$Vt(b)'' - Vn(b)'' = \frac{(rNh - rN1) \times rP}{(rNh + rP) \times (rN1 + rP)} \times Vcc$$

Accordingly, both of the potential differences Vt(a)"–Vn(a)" and Vt(b)"–Vn(b)" are high. Besides, the potentials Vn(a)' of the second read buses have exhibited a drop to $$Vn(a)' = \frac{rN1}{(rN1 + rLINE + rP)} \times Vcc$$

the potentials Vn(a)" and Vn(b)" of the second read buses according to the expressions (15) and (17) above are $$Vn(a)'' = \frac{rN1}{(rN1 + rP)} \times Vcc$$

$$Vn(b)'' = \frac{rN1}{(rN1 + rP)} \times Vcc$$

Accordingly, the potentials Vn(a)" and Vn(b)" are higher than the potentials Vn(a)'.

Having now fully described the invention, it will be apparent to one of ordinary skill in the art that many changes and modifications can be made thereto without departing from the spirit and scope of the invention as set forth herein.

What is claimed is:

1. A semiconductor storage device, comprising:
   a first read bus connected to a sense amplifier to which a bit line pair is input, said first read bus being input to a first data amplifier;
   a second read bus connected to a plurality of first data amplifiers and a precharge circuit and input to a second data amplifier;
   a third read bus output from said second data amplifier and input to a data output buffer; and
   an additional bus extending from said data output buffer to an output terminal;
   said first, second and third read buses and said additional bus cooperatively forming a read route;
   wherein said second read bus is connected to a plurality of said precharge circuits at a plurality of locations in a proximity of said first data amplifiers at a point were a parasitic resistance is highest from said second data amplifier.

2. A semiconductor storage device, comprising:
   a plurality of sense amplifiers;
   a plurality of first data amplifiers;
   a first read bus pair input to said sense amplifiers and one of said first data amplifiers so that a potential difference may be amplified by said first data amplifiers;
   a precharge circuit;
   a second data amplifier;
   a second read bus pair input to said first data amplifiers, said precharge circuit and said second data amplifier, said second read bus driven to a second potential with a capacity according to data of said first read bus pair by one of said first data amplifiers while driven to a first potential with a fixed capacity by said precharge circuit;
   a data output buffer;
   a third read bus pair input to said second data amplifier and said data output buffer and amplified by said second data amplifier in response to a potential difference of said second read bus pair;

an output terminal; and an additional bus extending from said data output buffer to said output terminal;

said first, second and third read buses and said additional bus cooperatively forming a read route;

said precharge circuit driving said second read bus pair at a position in the proximity of one of said first data amplifiers at a point where a parasitic resistance is highest from said second data amplifier.

3. A semiconductor storage device, comprising:

a plurality of sense amplifiers;

a plurality of first data amplifiers;

a first read bus pair input to said sense amplifiers and one of said first data amplifiers so that a potential difference may be amplified by said first data amplifiers;

a plurality of precharge circuits;

a second data amplifier;

a second read bus pair input to said first data amplifiers, said precharge circuits, and said second data amplifier and driven to a second potential with a capacity according to data of said first read bus pair by the one first data amplifier while driven to a first potential with a fixed capacity by one of said precharge circuits;

a data output buffer;

a third read bus pair input to said second data amplifier and said data output buffer and amplified by said second data amplifier in response to a potential difference of said second read bus pair;

an output terminal; and an additional bus extending from said data output buffer to said output terminal;

said first, second and third read buses and said additional bus cooperatively forming a read route;

said precharge circuits being connected to said second read bus pair at a plurality of locations in the proximity of one of said first data amplifiers at a location along said second read bus pair at a point where a parasitic resistance is highest from said second data amplifiers; and wherein said second read bus pair is driven to the first potential by one of said precharge circuits which is connected to said second read bus pair at a position nearest to a location at which one of said first data amplifiers which drives said second read bus pair to the second potential is connected to said second read bus pair.

4. A semiconductor storage device, comprising:

a sense amplifier for sensing a data bit read out from the semiconductor storage device;

a first data amplifier connected to said sense amplifier for amplifying said data bit;

a read bus connected to said first data amplifier;

a second data amplifier connected to said read bus for further amplifying said data bit; and a precharge circuit connected to said read bus in the proximity of said first data amplifier at a point where a parasitic resistance of said read bus is highest from said second data amplifier.

5. A semiconductor storage device as recited in claim 4 further comprising an output buffer for outputting said data bit from said second amplifier.

* * * * *